United States Patent
Walter et al.

(10) Patent No.: US 7,535,034 B2
(45) Date of Patent: May 19, 2009

(54) PNP LIGHT EMITTING TRANSISTOR AND METHOD

(75) Inventors: Gabriel Walter, Urbana, IL (US); Nick Holonyak, Jr., Urbana, IL (US); Milton Feng, Champaign, IL (US); Richard Chan, Merrimack, NH (US)

(73) Assignee: The Board of Trustees of The University of Illinois, Urbana, IL (US)

( * ) Notice: Subject to any disclaimer, the term of this patent is extended or adjusted under 35 U.S.C. 154(b) by 421 days.

(21) Appl. No.: 11/364,893

(22) Filed: Feb. 27, 2006

(65) Prior Publication Data

US 2007/0201523 A1 Aug. 30, 2007

(51) Int. Cl.
*H01L 33/00* (2006.01)

(52) U.S. Cl. .................. 257/197; 257/13; 257/14; 257/198; 257/E33.045; 372/43.01

(58) Field of Classification Search ............. 257/13, 257/14, 197, 198, 186, E33.045; 372/43.01
See application file for complete search history.

(56) References Cited

U.S. PATENT DOCUMENTS

| | | | |
|---|---|---|---|
| 2,569,347 A | 9/1951 | Shockley | |
| 4,485,391 A | 11/1984 | Poulain et al. ............ | 357/19 |
| 4,710,936 A | 12/1987 | Shibata et al. ............ | 372/45 |
| 4,845,535 A * | 7/1989 | Yamanishi et al. ........ | 315/172 |
| 4,958,208 A | 9/1990 | Tanaka ..................... | 357/34 |
| 5,003,366 A | 3/1991 | Mishima et al. ........... | 357/34 |
| 5,138,408 A * | 8/1992 | Ando ....................... | 257/134 |
| 5,166,761 A | 11/1992 | Olson et al. .............. | 257/46 |
| 5,239,550 A | 8/1993 | Jain ........................ | 372/45 |
| 5,293,050 A | 3/1994 | Chapple-Sokol et al. .... | 257/17 |
| 5,334,854 A | 8/1994 | Ono et al. ................ | 257/13 |
| 5,389,804 A | 2/1995 | Yokoyama et al. ......... | 257/197 |
| 5,399,880 A | 3/1995 | Chand ..................... | 257/21 |
| 5,414,273 A | 5/1995 | Shimura et al. ........... | 257/17 |
| 5,588,015 A | 12/1996 | Yang ....................... | 372/45.012 |

(Continued)

FOREIGN PATENT DOCUMENTS

EP 0709939 A1 5/1996

(Continued)

OTHER PUBLICATIONS

N. Holonyak, Jr. and I.A. Lesk, Gallium Arsenide Tunnel Diodes, Proc. IRE 48, pp. 1405-1409, 1960.

(Continued)

*Primary Examiner*—A. Sefer
*Assistant Examiner*—Eduardo A Rodela
(74) *Attorney, Agent, or Firm*—Martin Novack (57) ABSTRACT

A semiconductor light-emitting transistor device, including: a bipolar pnp transistor structure having a p-type collector, an n-type base, and a p-type emitter; a first tunnel junction coupled with the collector, and a second tunnel junction coupled with the emitter; and a collector contact coupled with the first tunnel junction, an emitter contact coupled with the second tunnel junction, and a base contact coupled with the base; whereby, signals applied with respect to the collector, base, and emitter contacts causes light emission from the base by radiative recombination in the base.

17 Claims, 4 Drawing Sheets

U.S. PATENT DOCUMENTS

| | | | | |
|---|---|---|---|---|
| 5,684,308 | A | 11/1997 | Lovejoy et al. | 257/184 |
| 5,705,825 | A * | 1/1998 | Ando | 257/25 |
| 5,723,872 | A | 3/1998 | Seabaugh et al. | 257/25 |
| 5,780,880 | A | 7/1998 | Enquist | 257/197 |
| 5,796,714 | A | 8/1998 | Chino et al. | 372/50 |
| 5,936,266 | A | 8/1999 | Holonyak, Jr. et al. | 257/106 |
| 6,031,256 | A * | 2/2000 | Liu et al. | 257/198 |
| 6,337,494 | B1 | 1/2002 | Ryum et al. | 257/197 |
| 6,479,844 | B2 | 11/2002 | Taylor | 257/192 |
| 6,737,684 | B1 | 5/2004 | Takagi et al. | 257/194 |
| 7,091,082 | B2 | 8/2006 | Feng et al. | 438/235 |
| 7,286,583 | B2 | 10/2007 | Feng et al. | 372/30 |
| 2002/0030195 | A1 | 3/2002 | Yoshii et al. | 257/101 |
| 2005/0040432 | A1 | 2/2005 | Feng et al. | 257/198 |
| 2005/0054172 | A1 | 3/2005 | Feng et al. | 438/313 |
| 2006/0208290 | A1* | 9/2006 | Feng et al. | 257/292 |

FOREIGN PATENT DOCUMENTS

| | | |
|---|---|---|
| EP | 0772269 A1 | 5/1997 |
| JP | 61231788 | 10/1986 |
| WO | WO 97/20353 | 6/1997 |
| WO | WO2005/020287 | 3/2005 |

OTHER PUBLICATIONS

T.A. Richard, E.I. Chen, A.R. Sugg. G.E. Hofler, and N. Holonyak, Jr., High Current Density Carbon-Doped Strained-Layer GaAs ($p^+$)-InGaAs($n^+$)-GaAs(n+) p-n Tunnel Diodes, Appl. Phys. Lett. 63, pp. 3613-3615, 1993).

A.R. Sugg, E.I. Chen, T.A. Richard, S.A. Maranowski, and N. Holonyak, Jr., n-p($p^+$-$n^+$)-n $Al_yGa_{1-y}As$—GaAs—$In_xGa_{1-x}As$ Quantum-Well Laser With $p^+$-$n^+$ GaAs—InGaAs Tunnel Contact On n-GaAs, Appl. Phys. Lett. 62, pp. 2510-2512 (1993).

M. Dallesasse, N. Holonyak Jr., A.R. Sugg, T.A. Richard, and N. El Zein, Hydrolyzation Oxidation Of $Al_xGa_{1-x}As$—AlAs—GaAs Quantum Well Heterostructures And Superlattices, Appl. Phys. Lett 57 pp. 2844-2846, 1990.

A.R. Sugg, E.I. Chen, T.A. Richard, N. Holonyak, Jr., and K.C. Hsieh, Native Oxide-Embedded $Al_yGa_{1-y}As$—GaAs—$In_xGa_{1-x}As$ Quantum Well Heterostructure Lasers, Appl. Phys. Lett. 62, pp. 1259-1261, 1993.

P.W. Evans, N. Holonyak, Jr., S.A. Maranowski, M.J. Ries, and E.I. Chen, Edge-Emitting Quantum Well Heterostructure Laser Diodes With Auxuliary Native-Oxide Vertical Cavity Confinement, Appl. Phys. Lett. 67, pp. 3168-3170, 1995.

D.L. Huffaker, D.G. Deppe, and K. Kumar, Native-Oxide Defined Ring Contact For Low Threshold Vertical-Cavity Lasers, Appl. Phys. Lett. 65, pp. 97-99, 1994.

J.J. Wierer, P.W. Evans, and N. Holonyak, Jr., "Buried Tunnel Contact Junction AlGaAs—GaAs—InGaAs Quantum Well Heterostructure lasers With Oxide-Defined lateral Currents", Appl. Phys. Lett. 71 (16), pp. 2286-2288, Oct. 20, 1997.

Light-Emitting Transistor: Light Emission From InGaP/GaAs Heterojunction Bipolar Transistors, M. Feng, N. Holonyak, Jr., and W. Hafez, Appl. Phys. Lett. 84, 151 (2004).

Quantum-Well-Base Heterojunction Bipolar Light-Emitting Transistor, M. Feng, N. Holonyak, Jr., and R. Chan, Appl. Phys. Lett. 84, 1952 (2004).

Type-II GaAsSb/InP Heterojunction Bipolar Light-Emitting Transistor, M. Feng, N. Holonyak, Jr., B. Chu-Kung, G. Walter, and R. Chan, Appl. Phys. Lett. 84, 4792 (2004).

Laser Operation Of A Heterojunction Bipolar Light-Emitting Transistor, G. Walter, N. Holonyak, Jr., M. Feng, and R. Chan, Appl. Phys. Lett. 85, 4768 (2004).

Microwave Operation And Modulation Of A Transistor Laser, R. Chan, M. Feng, N. Holonyak, Jr., and G. Walter, Appl. Phys. Lett. 86, 131114 (2005).

Room Temperature Continuous Wave Operation Of A Heterjunction Bipolar Transistor Laser, M. Feng, N. Holonyak, Jr., G. Walter, and R. Chan, Appl. Phys. Lett. 87, 131103 (2005).

Visible Spectrum Light-Emitting Transistors, F. Dixon, R. Chan, G. Walter, N. Holonyak, Jr., M. Feng, X. B. Zhang, J. H. Ryou, and R. D. Dupuis, Appl. Phys. Lett. 88, 012108 (2006).

The Transistor Laser, N. Holonyak, M Feng, Spectrum, IEEE vol. 43, Issue 2, Feb. 2006.

Signal Mixing In A Multiple Input Transistor Laser Near Threshold, M. Feng, N. Holonyak, Jr., R. Chan, A. James, and G. Walter, Appl. Phys. Lett. 88, 063509 (2006).

P. Grossman, and J. Choma, Jr., "Large Signal Modeling and HBT's Including Self-Heating and Transit Time Effects" IEEE Transactons On Microwave Theory And Techniques, vol. 40, No. 3, Mar. 1992.

Y. Mori, J. Shibata, Y. Sasai, H. Serizawa, and T. Kajiwara, "Operation Principle Of The InGaAsP/InP Laser Transistor", Appl. Phys. Lett. 47(7), Oct. 1, 1985.

J. Genoe, C. Van Hoof, K. Fobelets, R. Mertens, and G. Borghs, "pnp Resonant Tunneling Light Emitting Transistor" Appl. Phys. Lett. 62 (9), Aug. 31, 1992.

P. Berger, N. Chand, and N. Dutta, "An AlGaAs Double-Heterojunction Bipolar Transistor Grown By Molecular-Beam Epitaxy", Appl. Phys. Lett. 59 (9), Aug. 26, 1991.

E. Zanoni, L. Vendrame, and P. Pavan, "Hot-Electron Electroluminescence in AlGaAs/GaAs Heterojunction Bipolar Transistors", Appl. Phys. Lett. 62 (4), Jan. 25, 1993.

M. Harris, B. Wagner, S. Halpern and M. Dobbs, "Full Two-Dimensional Electroluminescent (EL) Analysis of GaAs/AlGaAs HBTs", IEEE 99CH36296. 37th Annual International Reliability Physics Symposium, San Diego., California, 1999.

K. Wang, P. Asbeck, M. Chang, G. Sullivan, and D. Millar, "Noninterfering Optical Method Of HBT Circuit Evaluation", Electronics Letters, vol. 25 No. 17, Aug. 17, 1989.

J. Bardeen and W.H. Brattain, "The Transistor, A Semi-conductor Triode," Physical Review 74, 230-234 (1948).

W. Shockley, "The Theory of p-n Junctions in Semiconductors and p-n Junction Transistors," Bell System Technology Journal 28, 435-489 (1949).

R.N. Hall, G.E. Fenner, J.D. Kingsley, T.J. Soltys, and R.O. Carlson, "Coherent Light Emission From GaAs Junctions," Phys. Rev. Lett., vol. 9. pp. 366-368, Nov. 1, 1962.

M.I. Nathan, W.P. Dumke, G. Burns, F.H. Dill, Jr., and G. Lasher, "Stimulated Emission of Radiation From GaAs p-n Junction," Appl. Phys. Lett., vol. 1, pp. 62-64. Nov. 1962.

N. Holonyak, Jr. and S.F. Bevacqua, "Coherent (Visible) Light Emission From GaAs $_{1-x}P_x$ Junctions," Appl. Phys. Lett., vol. 1, pp. 82-83, Dec. 1962.

T.M. Quist, R.H. Rediker, R.J. Keyes, W.E. Krag, B. Lax, A.L. McWhorter, and H.J. Zeiger, "Semiconductor Maser of GaAs," Appl. Phys. Lett., vol. 1. pp. 91-92, Nov. 1962.

H. Kroemer, "Theory Of A Wide-Gap Emitter For Transistors," Proceedings of the IRE 45, 1535-1537 (1957).

W. Hafez, J.W. Lai and M. Feng, "InP/InGaAs SHBTs with 75 nm Collector and fr>500 GHz", Electronic Letters, vol. 39, No. 20, Oct. 2003.

W. Hafez, J.W. Lai, and M. Feng "Record $f_T$ and $f_T+f_{MAX}$ Performance of InP/InGaAs Single Heterojunction Bipolar Transistors," Electronics Letters, May 2003.

W. Hafez, J.W. Lai, and M. Feng. "Sub-micron InP/InGaAs Single Heterojunction Bipolar Transistors With $f_T$ of 377 GHz," IEEE Electron Device Letters, May 2003.

W. Hafez, J.W. Lai and M. Feng, "Vertical scaling of 0.25 um Emitter InP/InGaAs Single Heterojunction Bipolar Transistors With $f_T$ of 452 GHz," IEEE Electron Device Letters, Jul. 2003.

P. Enquist, A. Paolella, A.S. Morris, F.E. Reed, L. DeBarros, A.J. Tessmer, and J.A. Hutchby, "Performance Evaluation Of Heterojunction Bipolar Transistors Designed For High Optical Gain", Research Triangle Institute, Research Triangle Park, NC, ARL, Research Laboratory, Ft. Monmouth, NJ, Applied Research and Technology, Wake Forest, NC, , IEEE, pp. 278-287, 1995.

Yukihiko Arai, Masaaki Sakuta, Hiroshi Takano, Takashi Usikubo, Ryozo Furukawa, and Masao Kobayashi, "Optical Devices From AlGaAs—GaAs HBTs Heavily Doped With Amphoteric Si", IEEE Transactions On Electron Devices, pp. 632-638, Vo. 42. No. 4, Apr. 1995.

G.W. Taylor, R.S. Mand, J.G. Simmons, and A.Y. Cho, "Ledistor—A Three-Terminal Double Heterostructure Optoelectronic Switch", Appl. Phys. Lett. 50 (6), Feb. 9, 1987.

N. Holonyak "Quantum-Well And Superlattice Lasers: Fundamental Effects" pp. 1-18, in "The Physics Of Submicron Structures", Plenum Press, 1984.

V. Ryzhii, M. Willander, M. Ryzhii and I. Khmyrova, "Heterostructure Laser-Transistors Controlled By Resonant-Tunnelling Electron Extraction", Semicond. Sci. Technol. 12 (1997) 431-438.

V. Ryzhi and I. Khmyrova, "Bistability Effect In Laser-Transistor Resonant-Tunneling Structure" Solid-State Electronics vol. 37 Nos. 4-6 pp. 1259-1262, 1994.

R. Bhat, W.-P. Hong, C. Caneau, M. A. Koza, C.-K. Nguyen, and S. Goswami, "InP/GaAsSb/InP And InP/GaAsSb/InGaAsP Double Heterojunction Bipolar Transistors With A Carbon-Doped Base Grown By Organometallic Chemical Vapor Deposition" Appl. Phys. Lett. 68, 985 (1996).

T. McDermott, E. R. Gertner, S. Pittman, C. W. Seabury, and M. F. Chang, "Growth And Doping Of GaAsSb Via Metalorganic Chemical Vapor Deposition For InP Heterojunction Bipolar Transistors" Appl. Phys. Lett. 58, 1386 (1996).

Dvorak, C. R. Bolognesi, O. J. Pitts, and S. P. Watkins, "300 GHz InP/GaAsSb/InP Double HBTs With High Current Capability And $BV_{CEO} \geq 6$ V" IEEE Elec. Dev. Lett. 22, 361 (2001).

V. de Walle, "Band Lineups And Deformation Potentials In The Model-Solid Theory" Physical Review B 39, 1871 (1989).

M. Feng, N. Holonyak, Jr. and W. Hafez, "Light-Emitting Transistor: : Light Emission From InGaP/GaAs Heterojunction Bipolar Transistors", Appl. Phys. Lett. 84, 151, Jan. 5, 2004.

J. Shibata, Y. Mori, Y. Sasai, N. Hase, H. Serizawa, and T. Kahwara "Fundamental Characteristics Of An InGaAsP/InP Laser Transistor", Electronic Letters, vol. 21, p. 98, 1985.

F. Jain, C. Chung, R. LaComb and M. Gokhale, "Resonant Tunneling Transistor Lasers: A New Approach To Obtain Multi-State Switching And Bistable Operation", International Journal Of Infrared And Millimeter Waves, Springer, Dordrecht, NL, vol. 14, No. 6, pp. 1311-1322, Jun. 1993.

Chun-Xia Du, Farice Duteil, Goran Hansson, and Wei-Xin Ni, "Si/SiGe/Si: Er: O Light-Emitting Transistors Prepared By Differential Molecular-Beam Epitaxy", App. Phys. Letts., vol. 78, No. 12, Mar. 19, 2001.

J. Hu et al., "Type II Photoluminescence And Conduction Band Offsets of GaAsSb/InGaAs and GaAsSb/InP Heterostructures Grown By Metalorganic Vapor Phase Epitaxy" Applied Physics Letters, 73(19) Nov. 1998.

Y. Yamashita et al., "Pseudomorphic $In_{0.52}Al_{0.48}As/In_{0.7}Ga_{0.3}As$ HEMTs With n Ultrahigh $f_T$ of 562 GHz", IEEE Electron Device Lett. 23 (10), 573-575 (2002).

* cited by examiner

| Label | Layer |
|---|---|
| 390 | emitter contact |
| 384 | confining |
| 383 | confining |
| 382 | confining |
| 381 | confining |
| 372 | tunnel junction |
| 371 | tunnel junction |
| 362 | emitter |
| 361 | emitter |
| 355 | base contact |
| 348 | base |
| 347 | base |
| 346 | base |
| 345 | base |
| 342 | base |
| 341 | base |
| 331 | collector |
| 330 | collector |
| 326 | tunnel junction |
| 327 | tunnel junction |
| 322 | etch stop |
| 320 | collector contact |
| 318 | confining |
| 317 | confining |
| 316 | confining |
| 308 | buffer |
| 305 | substrate |

370 brackets layers 371–372; 325 brackets layers 326–327.

PNP LIGHT EMITTING TRANSISTOR AND METHOD

GOVERNMENT SUPPORT

This invention was made with Government support under Contract Number HR0011-04-1-0034 awarded by the Defense Advanced Research Projects Agency (DARPA). The Government has certain rights in the invention.

FIELD OF THE INVENTION

This invention relates to semiconductor devices and methods, and also to PNP bipolar transistors, PNP bipolar light emitting transistors, and PNP bipolar transistor lasers.

BACKGROUND OF THE INVENTION

As described, for example, in PCT International Publication Number WO 2005/020287A2, and several publications [see, for example, M. Feng, N. Holonyak, Jr., and W. Hafez, "Light-Emitting Transistor: Light Emission From InGaP/GaAs Heterojunction Bipolar Transistors", Appl. Phys. Lett. 84, 151(2004); M. Feng, N. Holonyak, Jr., and R. Chan, "Quantum-Well-Base Heterojunction Bipolar Light-Emitting Transistor", Appl. Phys. Lett. 84, 1952 (2004); M. Feng, N. Holonyak, Jr., B. Chu-Kung, G. Walter, and R. Chan, "Type-II GaAsSb/InP Heterojunction Bipolar Light-Emitting Transistor", Appl. Phys. Lett. 84, 4792 (2004); G. Walter, N. Holonyak, Jr., M. Feng, and R. Chan, "Laser Operation Of A Heterojunction Bipolar Light-Emitting Transistor", Appl. Phys. Lett. 85, 4768 (2004); R. Chan, M. Feng, N. Holonyak, Jr., and G. Walter, "Microwave Operation And Modulation Of A Transistor Laser", Appl. Phys. Lett. 86, 131114 (2005); M. Feng, N. Holonyak, Jr., G. Walter, and R. Chan, "Room Temperature Continuous Wave Operation Of A Heterojunction Bipolar Transistor Laser", Appl. Phys. Lett. 87, 131103 (2005)], there has been developed and demonstrated a direct bandgap heterojunction bipolar transistor (HBT) that exhibits light emission from the base layer. Modulation of the base current produces modulated light emission. [As used herein, "light" means optical radiation that can be within or outside the visible range.] Three port operation of a light emitting HBT has been demonstrated. Both spontaneous light emission and electrical signal output are modulated by a signal applied to the base of the HBT.

Another aspect disclosed in the referenced U.S. Patent Applications and/or publications involves employing stimulated emission to advantage in the base layer of a bipolar transistor (e.g. a bipolar junction transistor (BJT) or a heterojunction bipolar transistor (HBT), in order to enhance the speed of the transistor. Spontaneous emission recombination lifetime is a fundamental limitation of bipolar transistor speed. In a form of the disclosed structures, the base layer of a bipolar transistor is adapted to enhance stimulated emission (or stimulated recombination) to the detriment of spontaneous emission, thereby reducing recombination lifetime and increasing transistor speed. Toward this end, and with other advantages, at least one layer exhibiting quantum size effects, such as a quantum well or a layer of quantum dots, can be provided in the base layer of the bipolar transistor. Preferably, at least a portion of the base layer containing the at least one layer exhibiting quantum size effects, is highly doped, and of a wider bandgap material than said at least one layer. The at least one quantum well, or layer of quantum dots, within the higher gap highly doped material, enhances stimulated recombination and reduces radiative recombination lifetime. A two-dimensional electron gas ("2-DEG") enhances carrier concentration in the quantum well or quantum dot layer, thereby improving mobility in the base region. Improvement in base resistance permits reduction in base thickness, with attendant reduction of base transport time. As disclosed in the referenced U.S. Patent Applications and/or publications, advantages in speed are applicable in high speed bipolar transistors in which light emission is utilized, and/or in high speed bipolar transistors in which light emission is not utilized. In light emitting bipolar transistor devices, for example heterojunction bipolar transistors of direct bandgap materials, the use of one or more layers exhibiting quantum size effects can also be advantageous in enhancing light emission and customizing the emission wavelength characteristics of the devices. By providing an optical resonant cavity enclosing at least a portion of the transistor base, a controllable high speed semiconductor laser is achieved. In this device, some gain $\beta$ ($\beta \equiv \Delta I_c/\Delta I_b$), is traded off for enhanced recombination ($\beta_{spon} > \beta_{stim}$).

The highly doped p-type base is essential to the operation of the n-p-n transistor lasers that have been constructed, but is also in some respects limiting. It poses conductive (resistive) loss because holes have relatively low mobility. Also, the high base doping (for example, of the order of $10^{19}$ cm$^{-3}$) leads to considerable free carrier absorption.

Although it has been understood that the above described types of light-emitting bipolar transistors and bipolar transistor lasers could theoretically be npn or pnp, to applicant's knowledge, the operational devices that have been made and demonstrated so far, have been npn devices. This is not surprising. In several respects, p-type material is recognized as being more difficult to work with than n-type material, and tends to be operationally inferior to corresponding n-type material with regard to carrier mobility and overall electrical efficiency. Accordingly, it is often considered desirable to favor the use of n-type semiconductor material in the fabrication of semiconductor devices such as III-V light emitting devices. However, even though the substrate and a fractional majority of the semiconductor volume in such devices may be n-type semiconductor or undoped semiconductor, a substantial amount of p-type material is generally considered necessary as a source of hole current in various semiconductor devices.

It is among the objects of the present invention to provide improved pnp bipolar transistors, and especially pnp light emitting bipolar transistors, including pnp bipolar transistor lasers.

SUMMARY OF THE INVENTION

For some applications, it may be desirable that a transistor laser be a pnp HBT rather than an npn HBT, assuming this leads to lower base region resistive loss (which is driven by lateral base currents) and, in addition, assuming lower free carrier absorption ($N_{DONOR} < N_{ACCEPTOR}$) since the base is located largely in the high field active region. In such applications we prefer to put heavily doped p-type crystal outside of the base region and to some extent outside of the high field active region of the transistor laser. Accordingly, one of the features of the invention is to devise an improved HBT laser, and to minimize the amount of acceptor-doped crystal required in the p-type emitter and in the high field p-type collector, by making these regions relatively thin and contacting them via tunnel junctions (i.e., p+ region contacted by n+ region to minimize the total thickness of p-type emitter and collector). [The "+" notation conventionally means "heavily doped", and, for purposes hereof, is generally donor impurity concentration of at least about $10^{18}/cm^3$ for n+, and acceptor impurity concentration of at least about $10^{19}/cm^3$ for p+.] In accordance with a feature of the invention, a pnp HBT light emitter is made with just enough p-type crystal to render operative the emitter (hole injection) function and the carrier collector function. That is, the current of the device is carried, to the extent possible, in higher mobility n-type crystal and not lower mobility p-type crystal, thereby minimizing resistive loss.

Tunneling in GaAs, at an n+/p+ junction, is well known (see, for example, N. Holonyak, Jr. and I. A. Lesk, Proc. IRE 48, 1405, 1960), and was once generally of interest for its negative resistance. Tunneling in GaAs can be enhanced with an InGaAs transition region (see, for example, T. A. Richard, E. I. Chen, A. R. Sugg. G. E. Hofler, and N. Holonyak, Jr., Appl. Phys. Lett. 63, 3613, 1993), and besides its negative resistance behavior, can be used in reverse bias as a form of "ohmic" contact. This allows, for example, the reversal of the doping sequence of an $Al_xGa_{1-x}As$—GaAs quantum well heterostructure laser (n→p to p→n) grown on an n-type GaAs substrate (see, for example, A. R. Sugg, E. I. Chen, T. A. Richard, S. A. Maranowski, and N. Holonyak, Jr., Appl. Phys. Lett. 62, 2510 (1993)). As described in the background portion of Holonyak et al. U.S. Pat. No. 5,936,266, a tunnel contact junction can be used in a light emitting semiconductor diode as a hole source and makes possible lateral bias currents (electron current) to drive a quantum well heterostructure (QWH) laser diode without the compromise of the low mobility and large resistive voltage drop of lateral conduction in thin p-type layers. This is particularly valuable in QWH laser diodes employing upper and/or lower native oxide confining layers (see, for example, M. Dallesasse, N. Holonyak Jr., A. R. Sugg, T. A. Richard, and N. El Zein, Appl. Phys. Lett 57 2844, 1990; A. R. Sugg, E. I. Chen, T. A. Richard, N. Holonyak, Jr., and K. C. Hsieh, Appl. Phys. Lett. 62, 1259, 1993) that require lateral bias currents (see, for example, P. W. Evans, N. Holonyak, Jr., S. A. Maranowski, M. J. Ries, and E. I. Chen, Appl. Phys. Lett. 67, 3168, 1995), or in devices such as a vertical cavity surface emitting laser (VCSEL) where lateral hole currents have been employed (see, for example, D. L. Huffker, D. G. Deppe, and K. Kumar, Appl. Phys. Lett. 65, 97, 1994). The structure in the U.S. Pat. No. 5,936,266 involved lateral current flow in laser diodes with hole conduction along a layer introducing a large device series resistance, because of the low hole mobility in GaAs, with increased threshold voltages and device heating. The solution to this drawback in the '266 Patent involved a tunnel contact junction on the p side of an oxide confined QWH that was used to replace lateral hole excitation currents. The hole injection was supported by a lateral electron current, thus providing lower voltage drop and less series resistance. One of the objectives there, as here, was to minimize the amount of p-type material and, to the extent possible, employ only n-type layers (electron conduction) to carry the device current. However, the problems in the present situation have different aspects, since a bipolar transistor is involved. As will be seen, part of the solution involves use of a tunnel junction for conversion from electron current to hole current, and another part of the solution involves use of a tunnel junction, in opposing orientation, for conversion of hole current to electron current.

In accordance with an embodiment of the invention, there is provided a semiconductor light-emitting transistor device which comprises: a bipolar pnp transistor structure having a p-type collector, an n-type base, and a p-type emitter; a first tunnel junction coupled with said collector, and a second tunnel junction coupled with said emitter; and a collector contact coupled with said first tunnel junction, an emitter contact coupled with said second tunnel junction, and a base contact coupled with said base; whereby, signals applied with respect to said collector, base, and emitter contacts causes light emission from said base by radiative recombination in said base. In a preferred form of this embodiment of the invention, the first tunnel junction comprises a layered n+/p+ region with the n+ layer of said n+/p+ region being coupled with said collector contact and the p+ layer of said n+/p+ region being coupled with said collector. Also, the second tunnel junction comprises a layered n+/p+ region with the n+ layer of said n+/p+ region being coupled with said emitter contact and the p+ layer of said n+/p+ region being coupled with said emitter.

A form of the described embodiment is a semiconductor laser device comprising the above-defined semiconductor light-emitting transistor device, further including an optical resonant cavity enclosing at least a portion of the base of said device. In one version of this form of the invention, at least a portion of said device is in layered form, and the optical resonant cavity is a lateral cavity with respect to the layer plane of said at least a portion of said device. In another version of this form of the invention, the optical resonant cavity is a vertical cavity with respect to the layer plane of said at least a portion of said device. Also in a preferred embodiment, the base of said device comprises a heavily doped n+ region, and there is further provided a region in said base exhibiting quantum size effects, such as one or more quantum wells and/or quantum dot layers.

In accordance with another embodiment of the invention, a method is set forth for producing light modulated with an input electrical signal, including the following steps: providing a bipolar transistor device that includes a p-type collector, an n-type base, and a p-type emitter; providing a first tunnel junction coupled with said collector, and a second tunnel junction coupled with said emitter; providing a collector contact coupled with said first tunnel junction, and providing an emitter contact coupled with said second tunnel junction, and providing a base contact coupled with said base; applying electrical signals with respect to said collector, base, and emitter contacts to cause light emission by radiative recombination in the base region; and controlling the base current of said transistor device with said input electrical signal to modulate the light emission from said transistor device.

The pnp transistor laser can have a number of advantages as compared to the npn transistor laser, as follows: (1) Lower base doping, with resultant reduction in free carrier absorption, lower lasing threshold, and reduced self-heating in the base region, as well as improved QW recombination spectra. (2) Lower base sheet resistance due to superior electron mobility, with accordant improvement in upper base current injection limit, higher power operation, reduced resistive heating in the base region, and also improved base current distribution under the emitter, resulting in lower lasing threshold and reduced edge heating. (3) Lower contact resistance, with resulting reduction in heating effect.

On top of the listed advantages, the present invention, employing the described tunnel junctions in the pnp transistor laser, can have a number of further advantages, as follows: (1) Reduced contact resistance to emitter and collector contact layers, resulting in reduced heating effect and reduced capacitive effect. (2) Lower collector sheet resistance, resulting in reduced heating effect and higher upper power (collector current$\times V_{CE}$) limit for collector current. (3) Lower series resistance through the emitter cladding layer, and accordant reduction of heating effect. (4) Lower free carrier absorption in the upper and lower cladding region (by minimization of highly doped P− region), resulting in reduced free carrier absorption, and accordant lower lasing threshold and reduced heating effect. It is recognized that the pnp HBT laser may not operate as at high a speed as a super high speed npn HBT, but it can still be an extremely high speed transistor laser with relatively lower current threshold and relatively higher collector voltage breakdown.

Further features and advantages of the invention will become more readily apparent from the following detailed description when taken in conjunction with the accompanying drawings.

DETAILED DESCRIPTION

Figure 1:
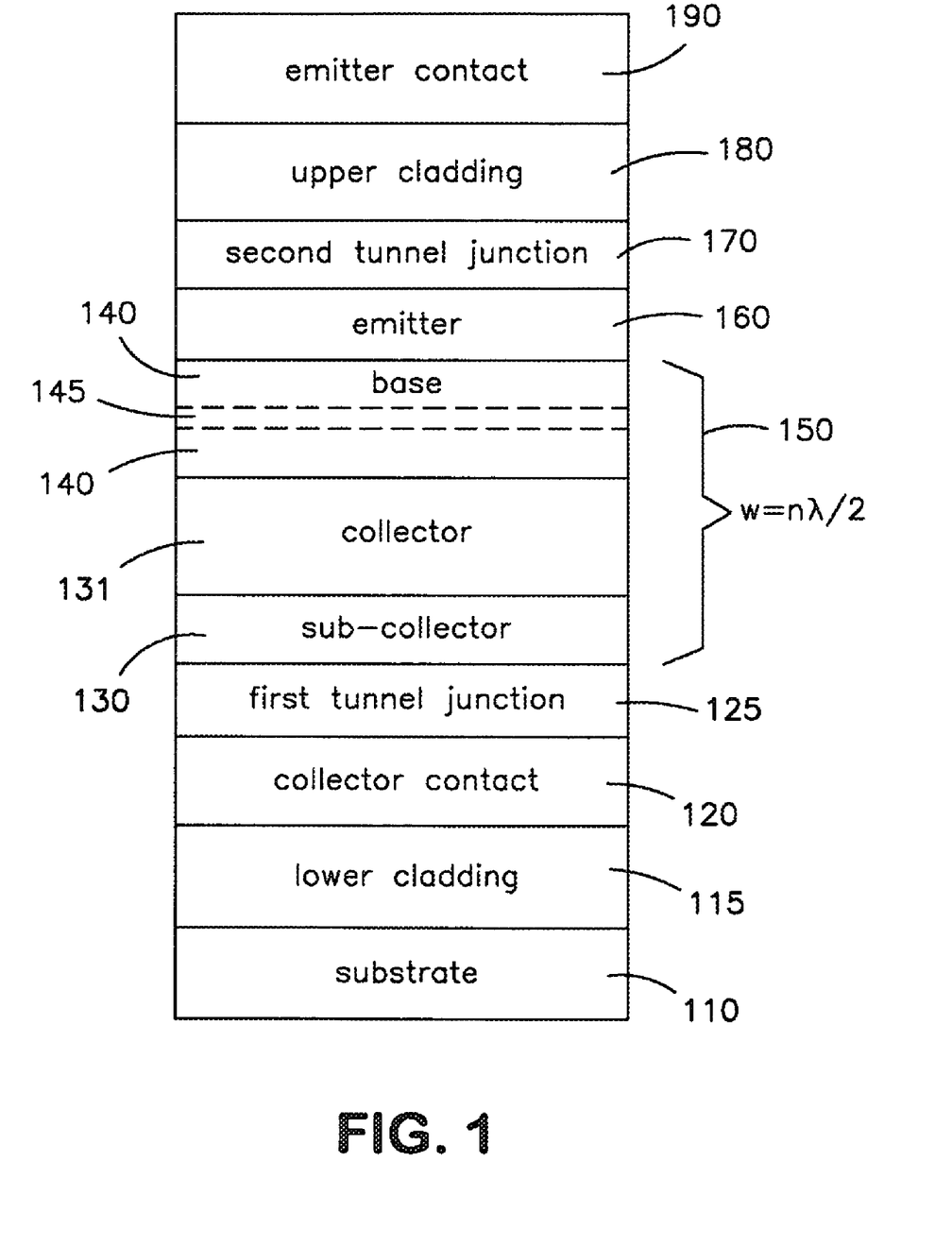
FIG. 1 is a simplified diagram, not to scale, of the layer structure of a pnp HBT laser in accordance with an embodiment of the invention and which can be used in practicing an embodiment of the method of the invention.

FIG. 1 is a simplified diagram of the layer structure for an embodiment of the invention. The substrate 110 can be undoped or doped, and has deposited thereon n-type cladding layer 115, n-type collector contact layer 120, a first tunnel junction 125, p-type sub-collector 130 and collector 131 (which can be intrinsic or lightly doped p-type), n-type base 140 containing at least one quantum size layer 145 (e.g. quantum well and/or quantum dot layer(s)), p-type emitter 160, second tunnel junction 170, n-type upper cladding layer 180, and n-type emitter contact layer 190. When this FIG. 1 embodiment is employed as an edge-emitting p-n-p heterojunction bipolar transistor (HBT) laser, the waveguide region (bracket 150) can be enclosed in an optical resonant cavity of width w equal to $n\lambda/2$, with $n=1,2,3 \ldots$, and $\lambda$ the characteristic emission wavelength. Note that the tunnel junctions 125 and 170 are preferably outside the active base region. In this embodiment, the first tunnel junction 125 includes a layered n+/p+ region with the n+ layer of the n+/p+ region being coupled with the collector contact layer 120, and the p+ layer of the n+/p+ region being coupled with the collector 131, via sub-collector 130. Also in this embodiment, the second tunnel junction 170 includes a layered n+/p+ region with the n+ layer of the n+/p+ region being coupled with the emitter contact layer 190, via upper cladding 180, and the p+ layer of the n+/p+ region being coupled with the emitter 160.

Figure 2:
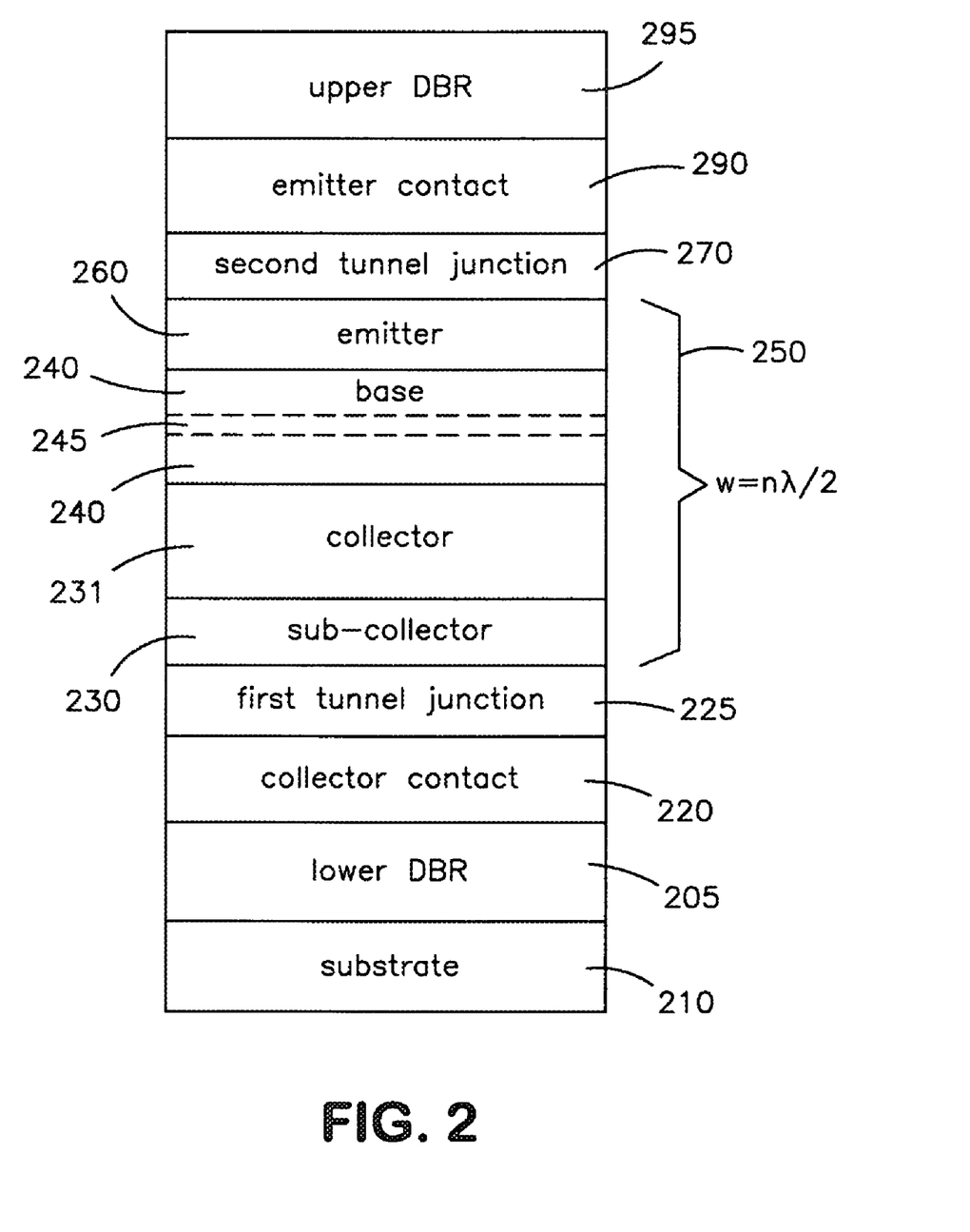
FIG. 2 is a simplified diagram, not to scale, of the layer structure of a pnp HBT laser in accordance with another embodiment of the invention and which can be used in practicing an embodiment of the method of the invention.

The embodiment of FIG. 2 can be employed as a vertical cavity p-n-p heterojunciton bipolar transistor (HBT) laser, by providing vertically oriented waveguide 250 within upper (295) and lower (205) DBRs, with waveguide dimension $n\lambda/2$, with $n=1,2,3 \ldots$, and $\lambda$ the characteristic emission wavelength. In the FIG. 2 embodiment, the further layers include the following: Substrate 210 has deposited thereon the lower DBR 205, n-type collector contact layer 220, first tunnel junction 225, p-type sub-collector 230 and collector 231 (which, as above, can be instrinsic or lightly doped p-type), n-type base 240 containing at least one quantum size layer 245 (again, e.g. quantum well and/or quantum dot layer(s)), p-type emitter 260, second tunnel junction 270, n-type emitter contact layer 290, and the upper DBR 295. In this embodiment, as before, the first tunnel junction 225 includes a layered n+/p+ region with the n+ layer of the n+/p+ region being coupled with the collector contact layer 220, and the p+ layer of the n+/p+ region being coupled with the collector 231, via sub-collector 230. The second tunnel junction 270 of this embodiment includes a layered n+/p+ region with the n+ layer of the n+/p+ region being coupled with the emitter contact layer 290, and the p+ layer of the n+/p+ region being coupled with the emitter 260.

Figure 3:
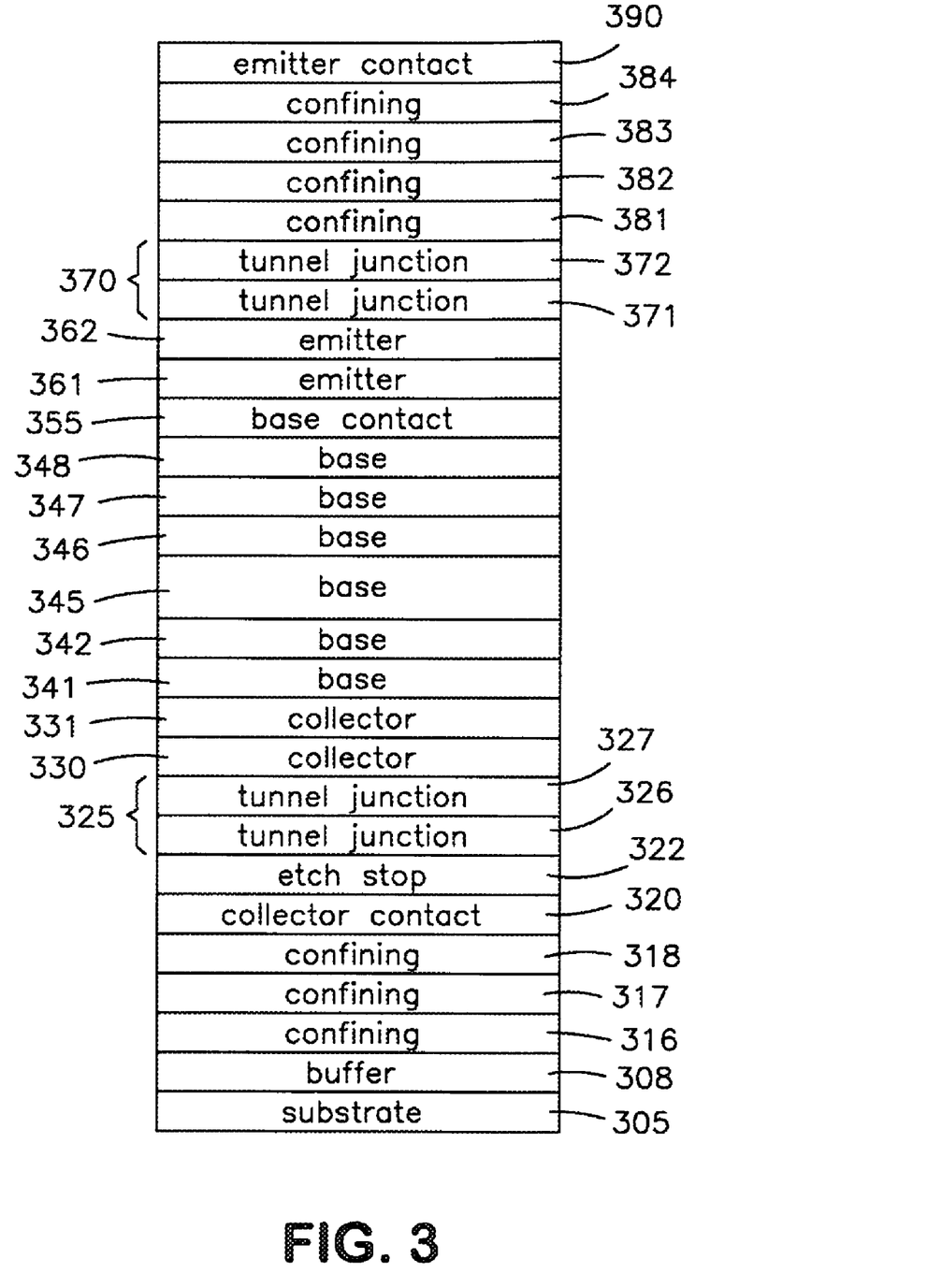
FIG. 3 is a diagram, not to scale, of the detailed layer structure of the FIG. 1 embodiment.

FIG. 3 illustrates in further detail an example of the embodiment of FIG. 1. The layered structure for this example is grown by MOCVD on a semi-insulating GaAs substrate 305. Upward from the substrate, the epitaxial layers of the crystal include a 3000 Å n-type heavily doped GaAs buffer layer 308, followed by a 634 Å n-type $Al_{0.35}Ga_{0.65}As$ layer 316, a 5000 Å n-type $Al_{0.95}Ga_{0.05}As$ layer 317, and a 200 Å n-type $Al_{0.35}Ga_{0.65}As$ layer 318, forming the lower cladding layers. These layers are followed by a 200 Å heavily doped n-type collector contact layer 320, and then a 120 Å heavily doped n-type $In_{0.49}Ga_{0.51}P$ etch stop layer 322, and the tunnel junction 325, which includes a 200 Å heavily Si-doped n-type $Al_{0.10}Ga_{0.90}As$ layer 326 and a 120 Å heavily C-doped p-type $Al_{0.10}Ga_{0.90}As$ layer 327. Next are the sub-collector and collector layers which comprise a 200 Å lightly doped p-type $Al_{0.10}Ga_{0.90}As$ layer 330 and a 400 Å lightly doped p-type GaAs layer 331. In this example, there is a 1010 Å n-type GaAs base that includes eleven layers, three of which (represented collectively at 345) comprise a 190 Å InGaAs quantum well (QW) designed for emission at $\lambda \approx 1000$ nm. (These three layers comprise a 150 Å layer of $In_{0.2}Ga_{0.8}As$ between 20 Å layers of $In_{0.1}Ga_{0.9}As$.) Starting after the last collector layer, the base layers are as follows: a 300 Å heavily Si doped n-type GaAs layer 341, a 10 Å undoped GaAs layer 342, followed by the previously described QW region 345, and then a 10 Å undoped GaAs layer 346, a 300 Å heavily Si doped n-type layer 347 and a 200 Å heavily doped n-type layer 348. Then, a 100 Å heavily Si-doped n-type GaAs layer is grown as a base contact layer 355. Subsequently, the following layers are grown: a heterostructure emitter comprised of a 150 Å p-type $In_{0.49}Ga_{0.51}P$ layer 361 and a 200 Å p-type $Al_{0.35}Ga_{0.65}As$ layer 362. This is followed by the tunnel junction 370, which includes a 150 Å heavily C doped p-type $Al_{0.35}Ga_{0.65}As$ layer 371 and a 300 Å heavily Si doped n-type $Al_{0.35}Ga_{0.65}As$ layer 372. Then, the upper confining or cladding region comprises a 150 Å n-type $Al_{0.80}Ga_{0.20}As$ oxidation buffer layer 381, and a 4000 Å n-type $Al_{0.95}Ga_{0.05}As$ oxidizable layer 382, a 300 Å n-type $Al_{0.80}Ga_{0.20}As$ oxidation buffer layer 383, and a 500 Å n-type $Al_{0.35}Ga_{0.65}As$ layer 384. The layered structure is capped with a 1000 Å heavily Si doped n-type GaAs emitter contact layer 390.

The process for fabricating the heterostructure bipolar pnp transistor laser continues by first patterning 4 μm protective $SiN_4$ stripes on the crystal with a photolithography step and reactive ion etching with Freon 14 ($CF_4$) gas. The top n-type GaAs contact layer 390 and $Al_{0.35}Ga_{0.65}As$ transition layer 384 are then exposed by wet etching (1:8:80 $H_2O_2$:$H_2SO_4$:$H_2O$) to form a ~4 μm emitter mesa. Since 1:8:80 $H_2O_2$:$H_2SO_4$:$H_2O$ wet etching solution is not selective to an $Al_{0.95}Ga_{0.05}As$ layer, a precise (~20 s) time etching is used in this example to stop at the interface of $Al_{0.95}Ga_{0.05}As$ layer 383. Next, a wide 11 μm protective photoresist (PR) stripe is placed over the emitter mesa and the unprotected layers (362, 370, 381, and 382) are removed with 1:8:80 $H_2O_2$:$H_2SO_4$:$H_2O$ selective wet etching solution, revealing the p-type $In_{0.49}Ga_{0.51}P$ wide-gap emitter layer 361. The protective photoresist (PR) stripe is then removed and the sample is oxidized for 7 min at 425° C. in a furnace supplied with $N_2+H_2O$, resulting in a ~0.9 μm lateral oxidation which forms ~2.2 μm oxide-defined apertures in the 4 μm emitter mesa. The samples are annealed (in $N_2$) at 425° C. for 7 minutes to reactivate p-dopants before the protective $SiN_4$ is removed by plasma ($CF_4$) etching. The emitter layer (361) $In_{0.49}Ga_{0.51}P$, is then removed using a wet etch (HCl), exposing the n-type GaAs base contact layer 355. A 37 μm PR window, is then patterned to form the base mesa for the base contact. The layers from 326 to 355 are then removed using a selective etch (10:1 $C_6H_8O_7:H_2O_2$), and the $In_{0.49}Ga_{0.51}P$ etch-stop layer 322 is removed by a wet etch (HCl), exposing the heavily doped n-type GaAs collector contact layer 320. Subsequently, a 5 μm PR window is formed over the base mesa, a 7 μm PR window is formed over the emitter mesa and oxide layer, and a 20 μm PR window is formed over the collector material to deposit AuGe/Ni/Au (750/150/10000 Å) to form, simultaneously, n-type metal contacts to the emitter contact layer 390, base contact layer 355 and collector contact layer 320. After the metal lift-off step, the sample is then annealed at 350° C. to form ohmic contacts. Then, a layer of polyimide is applied and cured at 270° C. to reduce the surface leakage current of the device. An additional layer of silicon nitride is deposited on top of the polyimide using a plasma-enhanced chemical vapor deposition (PECVD) system. Via hole openings to create contacts to emitter, base, and collector metals are defined using another photolithography step. Using Freon 14 ($CF_4$) gas and PR as an etch mask, the dielectric via opening to the silicon nitride layer is performed with a reactive ion etching (RIE) system. The PR is then stripped with cleaning solvents. Oxygen ($O_2$) plasma is used to remove the polyimide layer, the silicon nitride layer acting as an etch mask. After the contact via fabrication step, another photolighography step is performed to deposit Ti/Au (150 Å/2.5 μm) to form contacts from the device to ground-signal-ground (GSG) high frequency probing pads. The GSG probe pads are designed, in this example, as 400 μm cells so that multiple integer resonator lengths of 400 μm can be cleaved for device fabrication. The sample is then lapped to a thickness of ~50 μm. The HBTL samples are cleaved normal to the emitter stripes to form Fabry-Perot facets (at multiples of ~400 μm), and the substrate side of the crystal is alloyed onto Cu heat sinks coated with In for device operation.

Figure 4:
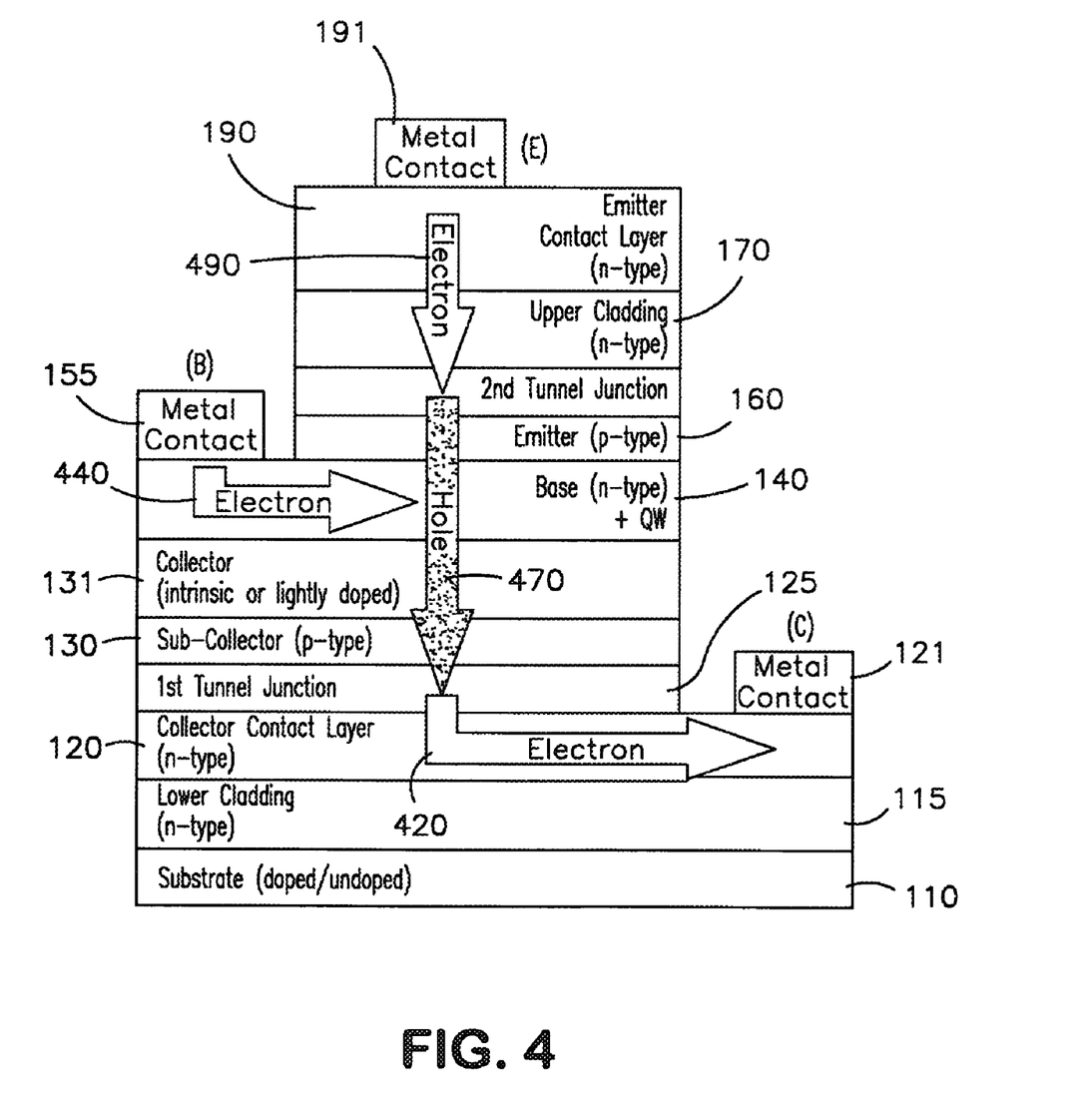
FIG. 4 is a diagram that illustrates the carrier flow pattern for an embodiment of the invention.

FIG. 4 shows the edge-emitting pnp HBT transistor laser with tunnel junction contacts on the p-type emitter and p-type collector. The device has the general layer structure of the FIG. 1 embodiment, with metal contacts shown (collector contact 121, base contact 155, and emitter contact 191), and the electron and hole current paths also illustrated. As in FIG. 1, the layer structure for this example includes substrate 110, n-type lower cladding 115, n-type collector contact layer 120, first tunnel junction 125, p-type sub-collector 130, p-type collector 131, n-type base 140 (with QW), p-type emitter 160, second tunnel junction 170, n-type upper cladding 180, and n-type emitter contact layer 190. As represented in the diagram by the darkened arrows 490 and 420, respectively, electron current is shown flowing, in n-type material, from the emitter contact to second tunnel junction 170, and, in n-type material, from the first tunnel junction 125 to the collector contact. Also, the electron current flow in the n-type base is represented by darkened arrow 440. As seen, the second tunnel junction 170 operates to convert electron current to hole current (lighter arrow 470), and the first tunnel junction 125 operates to convert hole current to electron current. In this manner, the relatively advantageous electron current in the n-type emitter contact layer and upper cladding, and also in the n-type collector contact layer, replaces what would otherwise be less efficient hole current in p-type material in a conventional pnp device.

The invention claimed is:

1. A semiconductor light-emitting transistor device, comprising:
    a bipolar pnp transistor structure having a p-type collector, an n-type base, and a p-type emitter;
    a first tunnel junction coupled with said collector, and a second tunnel junction coupled with said emitter; and
    a collector contact coupled with said first tunnel junction, an emitter contact coupled with said second tunnel junction, and a base contact coupled with said base;
    said first tunnel junction comprising a layered n+/p+ region with the n+ layer of said n+/p+ region being coupled with said collector contact and the p+ layer of said n+/p+ region being coupled with said collector;
    whereby, signals applied with respect to said collector, base, and emitter contacts causes light emission from said base by radiative recombination in said base.

2. The device as defined by claim 1, wherein said collector comprises a collector layer coupled with said base and a p-type sub-collector layer coupled with said collector contact.

3. The device as defined by claim 2, wherein said collector layer is intrinsic or lightly doped p-type.

4. A semiconductor laser device comprising the semiconductor light-emitting transistor device as defined by claim 2 further comprising an optical resonant cavity enclosing at least a portion of said base of said device.

5. The device as defined by claim 1, wherein said second tunnel junction comprises a layered n+/p+ region with the n+ layer of said n+/p+ region being coupled with said emitter contact and the p+ layer of said n+/p+ region being coupled with said emitter.

6. A semiconductor laser device comprising the semiconductor light-emitting transistor device as defined by claim 5, further comprising an optical resonant cavity enclosing at least a portion of said base of said device.

7. The laser device as defined by claim 6, wherein at least a portion of said device is in layered form, and wherein said optical resonant cavity is a lateral cavity with respect to the layer plane of said at least a portion of said device.

8. The laser device as defined by claim 6, wherein at least a portion of said device is in layered form, and wherein said optical resonant cavity is a vertical cavity with respect to the layer plane of said at least a portion of said device.

9. A semiconductor laser device comprising the semiconductor light-emitting transistor device as defined by claim 1, further comprising an optical resonant cavity enclosing at least a portion of said base of said device.

10. The laser device as defined by claim 9, wherein at least a portion of said device is in layered form, and wherein said optical resonant cavity is a lateral cavity with respect to the layer plane of said at least a portion of said device.

11. The laser device as defined by claim 9, wherein at least a portion of said device is in layered form, and wherein said optical resonant cavity is a vertical cavity with respect to the layer plane of said at least a portion of said device.

12. The device as defined by claim 1, wherein said transistor comprises a heterostructure of direct bandgap semiconductor material.

13. The device as defined by claim 12, wherein said base of said device comprises a heavily doped n+ region.

14. The device as defined by claim 12, further comprising a region in said base exhibiting quantum size effects.

15. The device as defined by claim 14, wherein said region in said base exhibiting quantum size effects comprises a quantum well layer.

16. The device as defined by claim 14, wherein said region in said base exhibiting quantum size effects comprises a layer of quantum dots.

17. A semiconductor light-emitting transistor device, comprising:
- a bipolar pnp transistor structure having a p-type collector, an n-type base, and a p-type emitter;
- a first tunnel junction coupled with said collector, and a second tunnel junction coupled with said emitter; and
- a collector contact coupled with said first tunnel junction, an emitter contact coupled with said second tunnel junction, and a base contact coupled with said base;
- said second tunnel junction comprising a layered n+/p+ region with the n+ layer of said n+/p+ region being coupled with said emitter contact and the p+ layer of said n+/p+ region being coupled with said emitter;
- whereby, signals applied with respect to said collector, base, and emitter contacts causes light emission from said base by radiative recombination in said base.

* * * * *